(12) United States Patent
Tang et al.

(10) Patent No.: US 9,546,421 B2
(45) Date of Patent: Jan. 17, 2017

(54) METHOD FOR FORMING FILM LAYER AND SUBSTRATE INCLUDING THE FILM LAYER

(71) Applicants: BOE TECHNOLOGY GROUP CO., LTD., Beijing (CN); BEIJING BOE DISPLAY TECHNOLOGY CO., LTD., Beijing (CN)

(72) Inventors: Hua Tang, Beijing (CN); Ran Zhao, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 35 days.

(21) Appl. No.: 14/363,784

(22) PCT Filed: Dec. 16, 2013

(86) PCT No.: PCT/CN2013/089486
§ 371 (c)(1),
(2) Date: Jun. 6, 2014

(87) PCT Pub. No.: WO2015/018160
PCT Pub. Date: Feb. 12, 2015

(65) Prior Publication Data
US 2015/0241727 A1 Aug. 27, 2015

(30) Foreign Application Priority Data

Aug. 6, 2013 (CN) .......................... 2013 1 0339744

(51) Int. Cl.
C23C 16/44 (2006.01)
C23C 16/40 (2006.01)
(Continued)

(52) U.S. Cl.
CPC ................. *C23C 16/44* (2013.01); *C23C 4/00* (2013.01); *C23C 4/06* (2013.01); *C23C 4/10* (2013.01);
(Continued)

(58) Field of Classification Search
None
See application file for complete search history.

(56) References Cited

U.S. PATENT DOCUMENTS

2010/0240214 A1  9/2010  Chiu et al.

FOREIGN PATENT DOCUMENTS

CN   1484069 A  *  3/2004
CN   1811557 A     8/2006
(Continued)

OTHER PUBLICATIONS

English language translation of International Preliminary Report on Patentability for PCT/CN2013/089486, Feb. 9, 2016, 9 pages.*
(Continued)

*Primary Examiner* — William Phillip Fletcher, III
(74) *Attorney, Agent, or Firm* — Blakely, Sokoloff, Taylor & Zafman LLP

(57) ABSTRACT

A method of forming a film layer and a substrate comprising the film layer to reduce occurrence of defects and improve the quality of the film layer are described. The method of forming a film layer comprises forming a plurality of sub-film layers of a same material overlapped with each other on a substrate by multiple steps to constitute the film layer, wherein each time a sub-film layer is formed, the newly-formed sub-film layer is cleaned immediately. The substrate comprises a film layer formed by the above method.

9 Claims, 4 Drawing Sheets

(51) Int. Cl.
| | |
|---|---|
| C23C 14/08 | (2006.01) |
| C23C 14/22 | (2006.01) |
| C23C 4/00 | (2016.01) |
| G02F 1/1343 | (2006.01) |
| C23C 4/06 | (2016.01) |
| C23C 4/12 | (2016.01) |
| C23C 4/18 | (2006.01) |
| C23C 4/10 | (2016.01) |
| C23C 14/00 | (2006.01) |
| C23C 16/00 | (2006.01) |
| C23C 14/34 | (2006.01) |
| C23C 14/58 | (2006.01) |
| C23C 16/56 | (2006.01) |
| C23C 14/02 | (2006.01) |
| B08B 11/00 | (2006.01) |
| B05D 7/00 | (2006.01) |
| B05D 5/00 | (2006.01) |
| B05D 1/02 | (2006.01) |
| B05D 1/08 | (2006.01) |
| B05D 3/10 | (2006.01) |
| B05D 1/10 | (2006.01) |
| G02F 1/13 | (2006.01) |

(52) U.S. Cl.
CPC . *C23C 4/11* (2016.01); *C23C 4/12* (2013.01); *C23C 4/123* (2016.01); *C23C 4/129* (2016.01); *C23C 4/18* (2013.01); *C23C 14/00* (2013.01); *C23C 14/021* (2013.01); *C23C 14/024* (2013.01); *C23C 14/08* (2013.01); *C23C 14/081* (2013.01); *C23C 14/082* (2013.01); *C23C 14/083* (2013.01); *C23C 14/085* (2013.01); *C23C 14/086* (2013.01); *C23C 14/087* (2013.01); *C23C 14/088* (2013.01); *C23C 14/22* (2013.01); *C23C 14/34* (2013.01); *C23C 14/5873* (2013.01); *C23C 16/00* (2013.01); *C23C 16/40* (2013.01); *C23C 16/401* (2013.01); *C23C 16/402* (2013.01); *C23C 16/403* (2013.01); *C23C 16/404* (2013.01); *C23C 16/405* (2013.01); *C23C 16/406* (2013.01); *C23C 16/407* (2013.01); *C23C 16/408* (2013.01); *C23C 16/409* (2013.01); *C23C 16/56* (2013.01); *G02F 1/13439* (2013.01); *B05D 1/02* (2013.01); *B05D 1/08* (2013.01); *B05D 1/10* (2013.01); *B05D 3/105* (2013.01); *B05D 3/107* (2013.01); *B05D 5/00* (2013.01); *B05D 7/50* (2013.01); *B05D 7/52* (2013.01); *B05D 7/56* (2013.01); *G02F 2001/1316* (2013.01); *Y10T 428/24752* (2015.01)

(56) References Cited

FOREIGN PATENT DOCUMENTS

| | | |
|---|---|---|
| CN | 102137951 A | 7/2011 |
| CN | 102244036 A | 11/2011 |
| CN | 102732855 A | 10/2012 |
| CN | 103439839 A | 12/2013 |
| JP | 2010212712 A | 9/2010 |

OTHER PUBLICATIONS

PCT Notification of Transmittal of the International Search Report and the Written Opinion of the International Searching Authority, or the Declaration for counterpart PCT Application No. PCT/CN2013/089486, 13 pp., (Jun. 10, 2014).

PCT International Search Report for counterpart PCT Application No. PCT/CN2013/089486, 2 pp. (English translation only), (Jun. 10, 2014).

PCT Written Opinion of the International Searching Authority for counterpart PCT Application No. PCT/CN2013/089486, 5 pp. (English translation only), (Jun. 10, 2014).

First Office Action for corresponding Chinese Patent Application No. 201310339744.1, 15 pp. (including English translation), (Jun. 3, 2015).

* cited by examiner

METHOD FOR FORMING FILM LAYER AND SUBSTRATE INCLUDING THE FILM LAYER

CROSS-REFERENCE TO RELATED APPLICATIONS

This patent application is a U.S. National Phase Application under 35 U.S.C. §371 of International Application No. PCT/CN2013/089486, filed Dec. 16, 2013, entitled METHOD FOR FORMING FILM LAYER AND SUBSTRATE INCLUDING THE FILM LAYER, which claims priority to Chinese Patent Application No. 201310339744.1, filed Aug. 6, 2013.

FIELD OF THE INVENTION

The present invention relates to the field of film layer fabricating technology, and particularly to a method for forming a film layer and a substrate including a film layer formed by the method.

BACKGROUND OF THE INVENTION

Indium tin oxide film (ITO film), as an important kind of transparent conductive film due to its excellent conductivity and visible-light transmittance, is widely used in photoelectric devices. At present, the ITO film is fabricated generally by using magnetron sputtering technique. In the magnetron sputtering technique, the plasma discharging is implemented under vacuum conditions, the movements of charged particles are controlled through electromagnetic field so that a target is bombarded by the moving particles, and atoms of the target are knocked off and attached to the substrate, thereby a desired thin film is formed on the substrate.

Nowadays, it is necessary for a Twist Nematic (TN) type liquid crystal display panel to have an ITO film formed on the color film substrate as a common electrode. However, the ITO film formed by using the magnetron sputtering technique has defects on film surface, for example, pin holes are likely to appear on the film surface. The cause and process of producing the pin holes are illustrated in FIGS. 1 and 2. During film coating, if there is a foreign matter 21 (e.g. dust, foreign particle and the like) on the color film substrate 1, a bump will be formed on the ITO film surface after film coating. In subsequent cleaning process, the bump is removed by washing, and a pin hole 22 is produced passing through the ITO film 2. The pin hole 22 will be displayed as an abnormal spot when the cell-forming process of the display panel is finished, which will negatively impact on the qualified rate of the liquid crystal display panel. Obviously, it is necessary to avoid forming the pin hole 22. An existing method for reducing the occurrence rate of the pin holes 22 is that a pre-cleaning process is performed before the film coating process, and the devices are all sealed and cleaned periodically before the film coating process. However, it is obvious that such method can only reduce the foreign matters on the substrate before the film coating process, and can hardly eliminate the foreign matters completely. Furthermore, in the liquid crystal display panels, a voltage should be applied to the common electrode so as to control the switch between dark and light for the pixel units. Thus, in order to ensure that the common electrode can withstand a desired voltage, the ITO film acting as the common electrode should have a certain thickness. Presently, the thickness of the ITO film on the color substrate in the TN type liquid crystal display panel is generally 150 nm.

When fabricating the ITO film 2 with a thickness of 150 nm, the power of the film-coating equipment is 14.6 kW, which corresponds to a production time of 35 second per product. However, in actual production, when the film-coating power is higher than 8 to 9 kW, the probability that knobbles (protuberances) are generated on the surface of the target and on the ITO film 2 on the color substrate increases dramatically. The knobbles on the ITO film 2 are apt to form pin holes. Furthermore, the knobbles on the surface of the target are apt to cause point discharge so that the surface of the ITO film 2 formed by film coating protrudes to form a protruding part which cannot be removed by washing and should be removed by polishing during repairing process, thus deteriorating the quality of film coating, and resulting in undesirable values of film-surface resistance and transmittance. Further, due to these effects, the production line has to be suspended so as to polish and wash the surface of the target to remove the knobbles periodically. Consequently, the maintenance time for the equipments increases greatly, and the utilization, which means the percentage of time spent on creating value by the equipment in a planned time, is reduced.

When the film layer is formed by using other processes (e.g., the evaporating process, the sputtering process, the chemical vapor deposition process, the spraying process, and so on), the phenomenon of defective film surface caused by the foreign matters also occurs, and thereby the performance of subsequent products is affected.

SUMMARY OF THE INVENTION

In view of the fact that the defective film layer is likely to arise in the film layers formed by using the method of the prior art, an object of the present invention is to provide a method of forming a film layer which can reduce the occurrence of defective film layer and improve the quality of the film layer.

In order to achieve the above object, the invention provides a method of forming a film layer comprising forming a plurality of sub-film layers of a same material overlapped with each other on a substrate by multiple steps to constitute the film layer, wherein each time a sub-film layer is formed, the newly-formed sub-film layer is cleaned immediately.

Preferably, the plurality of sub-film layers includes two sub-film layers, and the method comprises the steps of forming a first sub-film layer on the substrate, performing a first cleaning process on the first sub-film layer, forming a second sub-film layer on the first sub-film layer, and performing a second cleaning process on the second sub-film layer.

Preferably, the ratio between the thicknesses of the first sub-film layer and the second sub-film layer ranges from 0.5 to 2.

More preferably, the thickness of the first sub-film layer is equal to that of the second sub-film layer.

Preferably, the step of forming the first sub-film layer is performed by one of the evaporating process, the sputtering process, the chemical vapor deposition process and the spraying process; and the forming the second sub-film layer is performed by one of the evaporating process, the sputtering process, the chemical vapor deposition process and the spraying process.

More preferably, power of equipment for forming the sub-film layers is controlled so that the size of each of knobbles formed on the sub-film layers is less than 50 microns.

Preferably, the cleaning process includes cleaning with pure water and cleaning with gas, and is used for removing foreign matters and knobbles on the sub-film layers.

Preferably, the material of the film layer is metal or metal oxide.

More preferably, the material of the film layer is indium tin oxide.

Another object of the invention is to provide a substrate of good quality comprising a film layer In order to achieve the above object, the invention provides a substrate comprising a film layer formed by using the above-mentioned method of forming a film layer.

Preferably, the substrate is a color film substrate and the film layer serves as a common electrode.

More preferably, thickness of the film layer ranges from 135 nm to 150 nm.

Reference numbers: 1. color substrate; 2. indium tin oxide film (ITO film); 21. foreign matter; 22. pin hole; 201. first sub-film layer; 202. second sub-film layer.

DETAILED DESCRIPTION OF THE EMBODIMENTS

The present invention will be explained in detail below with reference to specific embodiments in connection with accompanying drawings so that technical solutions of the present invention can be better understood by the skilled in the art.

Embodiment 1

The method of forming a film layer according to the present invention comprises forming a plurality of sub-film layers of a same material overlapped with each other on a substrate by multiple steps to constitute the film layer, wherein each time a sub-film layer is formed, the newly formed sub-film layer is cleaned immediately. The principle of the invention will be explained with reference to the embodiment illustrated in FIGS. 3 to 7 in the following. In the present embodiment, a case that a film layer to be formed includes two sub-film layers is described. However, it will be understood that the invention is not limited thereto, and may also be applied to cases that three or more sub-film layers are included.

As shown in FIGS. 3 to 7, the method of forming a film layer provided by the embodiment comprises the following steps.

Figure 3:
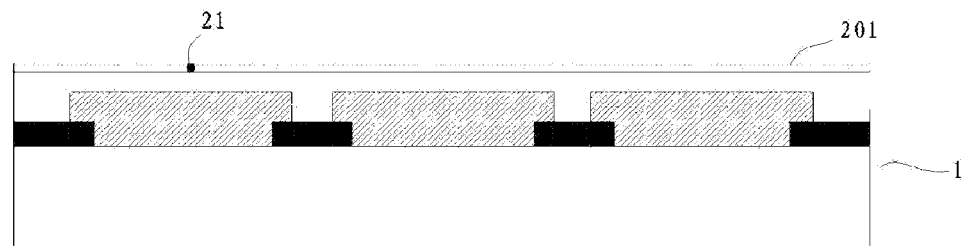
FIG. 3 is a schematic diagram illustrating the structure after a first sub-film layer is formed by using the method of forming a film layer according to embodiment 1 of the invention.

In S101, as shown in FIG. 3, a first sub-film layer 201 is formed on the substrate 1. A foreign matter 21, which may be dust, a particle and the like, may exist on the substrate 1, and may lead to defective film surface of the formed first sub-film layer 201, e.g., it may result in the generation of the pin hole 22 after the cleaning process.

Preferably, the step of forming the first sub-film layer 201 is performed by one of the evaporating process, the sputtering process, the chemical vapor deposition process and the spraying process.

It should be pointed out that there are various approaches for forming the film layer, such as the evaporating process, the sputtering process, the chemical vapor deposition process, the spraying process, and so on. Since a film layer formed by any one of these processes may have the problem of defective film surface, the method according to the present invention is applicable to any one of the above processes. Preferably, the first sub-film layer 201 is formed by the sputtering process in the present embodiment, because the film formed by the sputtering process has high density, less pin holes, high purity, and excellent controllability and repeatability with respect to the film thickness.

Furthermore, the sputtering process is generally classified into the DC sputtering process and RF sputtering process. The DC sputtering process is preferably employed in this embodiment, since the RF sputtering process has strict demand for equipment and thereby is high in cost.

Preferably, the conditions for forming the first sub-film layer 201 include working vacuum degree of 0.1 to 1 Pa, working temperature of 110 to 150° C., and working gas of a mixture of argon and oxygen in which the volume percent of oxygen is 1% to 3%.

It will be understood that certain conditions should be satisfied when the film layer is formed on the substrate.

It should be further pointed out that the working temperature is preferably stabilized at 120° C. Specifically, heat is transferred through heating wire, the temperature of which varies from 150 to 400° C. depending on the position of the heating wire, while the temperature is stabilized by cooling water pipes arranged all over the inside of the chamber of the sputtering equipment (preferably, the inlet temperature of the cooling water pipe is 32° C., and the outlet temperature is 35° C.). Generally, there are two types of sputtering process, i.e. high temperature (230° C.) sputtering and low temperature (120° C.) sputtering. The low temperature (120° C.) sputtering is preferably employed in this embodiment, since a special high-temperature heating chamber is not required for heating, the range of temperature is narrow, and thereby the utilization is high in the case of low temperature sputtering.

Preferably, the material of the first sub-film layer is metal or metal oxide.

From above, various types of film layers made of metal or metal oxide materials and formed by the sputtering process may have the problem of defective film surface, such as the generation of the pin holes 22 and the knobbles and the like, and thereby the film quality may be affected. Thus, the method of forming a film layer according to the present invention may be applied in the process so as to improve the film quality.

Further preferably, the material of the first sub-film layer 201 is indium tin oxide.

It should be pointed out that, the reason that the material of the first sub-film layer 201 is preferably indium tin oxide is as follows. In the film fabricating process for forming the ITO film 2 on the color film substrate 1, the defective film surface, for example, having the pin hole 22 and the knobble and the like thereon, has a great effect upon the qualified rate. Thus, a case in which the ITO film 2 is formed on the color film substrate is taken as an example for describing the invention.

Preferably, the first sub-film layer 201 has a thickness of 50 nm to 100 nm.

The reason that the thickness of the first sub-film layer 201 preferably ranges from 50 nm to 100 nm in this embodiment is as follows. As for the color film substrate 1, the film fabricating process is used to form the common electrode serving as a voltage switch of the array substrate, by which the dark-and-light control over the pixel units is achieved. Thus, there is particular requirement for the thickness of the film layer on the color film substrate 1. At present, the thickness of the ITO film 2 on the color film substrate 1 in the TN type liquid crystal display panel is generally 150 nm. Since the method of forming a film layer provided by this embodiment includes two steps of film formation, the total thickness of the film layer may be 150 nm after the two film-forming steps. Preferably, if the thickness of the first sub-film layer 201 ranges from 50 nm to 100 nm, it can ensure that the thicknesses of both the first sub-film layer 201 and the second sub-film layer formed in a subsequent step will be neither too small nor too large, and thereby guarantee excellent quality of the film layer.

Further preferably, the power of the equipment for forming the first sub-film layer 201 is controlled so that the size of each knobble formed on the first sub-film layer 201 is smaller than 50 microns.

For example, when a film layer is formed by the sputtering process, the power of the equipment for forming the first sub-film layer 201 is preferably controlled below 8 kW, more preferably ranging from 6.8 kW to 7.8 kW.

This is because the critical value of the power causing the generation and rapid increase of the knobbles on the surface of the target and the ITO film 2 is about 8 kW to 9 kW when forming the film layer by the sputtering process. That is, in forming the film layer, compared to the case that the power of the equipment is smaller than 8 kW, more knobbles will be generated on the surface of the target and the ITO film 2 in the case that the power of the equipment is larger than 8 kW. Thus, the power of the equipment for forming the first sub-film layer 201 in this embodiment is preferably smaller than 8 kW, and more preferably ranging from 6.8 kW to 7.8 kW, thereby the knobbles are less prone to occurring on the surface of the target and the ITO film 2. Accordingly, the probability of the occurrence of pin hole 22 due to the knobble on the ITO film 2 is reduced. Also, since there is a smaller number of knobbles on the surface of the target, the point discharging caused by the knobbles on the surface of the target will be less prone to occurring. Thus it eliminates the need to frequently polish the target, the frequency and the time for cleaning and maintenance are reduced, and the production efficiency is improved. Also, on the surface of the target with less knobbles, the ITO film 2 formed by the sputtering is less prone to having bumps on film surface (i.e., the film surface is uneven and partial regions have a height exceeding a certain value; such bumps cannot be removed by cleaning, and need to be polished in the subsequent repairing process).

In other words, the power of the equipment is controlled below 8 kW, for example, ranging from 6.8 kW to 7.8 kW. This can not only reduce the frequency and the time for cleaning and maintaining the target, but also guarantee good quality of the film layer formed on the target by sputtering, and the utilization of the whole production line is improved.

It may be understood that different powers may be set for different equipment depending on the respective equipment, so that the size of each knobble formed on the first sub-film layer 201 is less than 50 microns.

In S102, a first cleaning process is performed.

Preferably, the first cleaning process includes cleaning with pure water and cleaning with gas, and is used for removing the bumps on the first sub-film layer 201 formed due to the foreign matters 21 and the knobbles on the first sub-film layer 201.

Specifically, the first cleaning process includes: washing with pure water while rotating a brush to cooperate with the washing, wherein the flow velocity of the pure water ranges from 145 L/min to 150 L/min, and is preferably 150 L/min; washing with both pure water and clean air, wherein the flow velocity of the two-fluid (the pure water and the clean air) ranges from 55 L/min to 60 L/min, and is preferably 60 L/min; rinsing with pure water, wherein the flow velocity of the pure water ranges from 135 L/min to 140 L/min, and is preferably 138 L/min; and blow-drying with an air knife device, wherein the flow velocity of the air ranges from 3300 L/min to 3500 L/min, and is preferably 3400 L/min.

Figure 4:
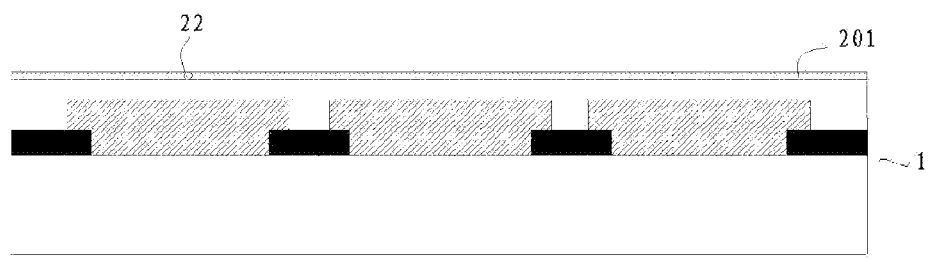
FIG. 4 is a schematic diagram illustrating the structure after a first cleaning process is performed on the first sub-film layer by using the method of forming a film layer according to the embodiment 1 of the invention.

As shown in FIG. 4, when the first cleaning process is performed, the bump corresponding to the foreign matter 21 shown in FIG. 3 on the first sub-film layer 201 is removed by washing, and thereby the pin hole 22 is formed. For the sake of convenience, only one foreign matter 21 is shown and thus only one pin hole 22 is formed. However, there may be a plurality of foreign matters and pin holes. In addition to the foreign matter 21, the knobble formed on the ITO film 2 will also give rise to generating the pin hole 22 when the knobble is removed by washing in the process of forming the film layer.

Figure 5:
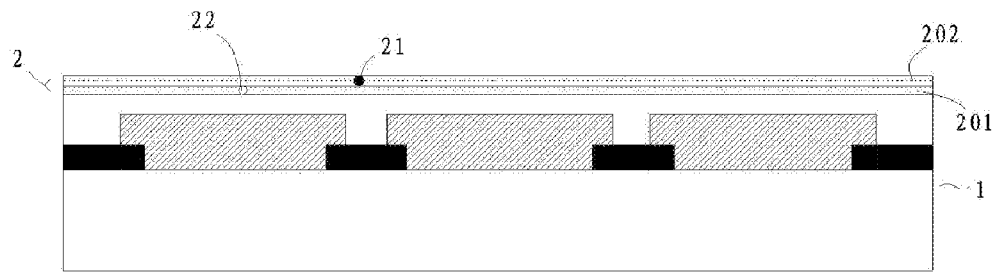
FIG. 5 is a schematic diagram illustrating the structure after a second sub-film layer is formed by using the method of forming a film layer according to the embodiment 1 of the invention.

In S103, as shown in FIG. 5, a second sub-film layer 202 is formed on the first sub-film layer 201. The material of the second sub-film layer 202 is the same as that of the first sub-film layer 201, that is, preferably is indium tin oxide as well.

It is readily understand that one process for forming a film layer in the existing technology is implemented by two separate sub-processes in the embodiment, and thus the materials of the sub-film layers formed in the two separate sub-processes are obviously the same.

Furthermore, only one foreign matter 21 on the second sub-film layer 202 is illustrated in FIG. 5, however, this number of the foreign matter 21 should not be deemed as limitation. On each of sub-film layers formed in respective sub-processes, the positions of the foreign matters 21 are random. It may be understood that there is little chance that the foreign matters 21 are formed at the same position of the respective sub-film layers in two separate sub-processes.

It should be further pointed out that the more the number of the sub-processes for forming sub-film layers, the smaller the probability of forming the pin holes 22 (i.e. the probability of forming the pin holes 22 at the same position of the respective sub-film layers in two separate sub-processes is very small, the probability of forming the pin holes 22 at the same position of the respective sub-film layers in three separate sub-processes is smaller, and so on). Considering the tradeoff between the increasing cost and the improved quality of the film layer resulting from the increasing number of sub-processes for forming the sub-film layers, the number of sub-processes for forming the sub-film layers may be determined according to specific applications. In the present embodiment in which the ITO film 2 on the color substrate 1 is formed, since there will be no remarkable effect on quality improvement in the case that the number of sub-processes for forming the sub-film layers is up to three or more, it is preferable to form the film layer in two film-forming sub-processes.

Preferably, the step of forming the second sub-film layer 202 is performed by one of the evaporating process, the sputtering process, the chemical vapor deposition process and the spraying process.

It should be pointed out that there are various approaches for forming the film layer, such as the evaporating process, the sputtering process, the chemical vapor deposition process, the spraying process, and so on. Preferably, the sputtering process is employed in the present embodiment, because the film formed by the sputtering process has high density, less pin holes, high purity, and excellent controllability and repeatability with respect to the film thickness.

Furthermore, the sputtering process is generally classified into DC sputtering process and RF sputtering process. The DC sputtering process is preferably employed in this embodiment, since RF sputtering process has strict demand for equipment and thereby is high in cost.

Preferably, the conditions for forming the second sub-film layer 202 include working vacuum degree of 0.1 to 1 Pa, working temperature of 110 to 150° C., and working gas of a mixture of argon and oxygen in which the volume percent of the oxygen is 1% to 3%.

Obviously, the conditions for forming the second sub-film layer 202 are preferably the same as those for the first sub-film layer 201 without being changed. The second sub-film layer 202 can be formed simply by supplying the substrate, which is cleaned after the first sub-film layer 201 is formed thereon, into the same equipment used for forming the first sub-film layer 201. Such design is advantageous for the automatic production and the line operation.

More preferably, the thickness of the second sub-film layer 202 ranges from 50 nm to 100 nm.

It should be pointed out that the thickness of the second sub-film layer 202 may be correspondingly adjusted based on the thickness of the formed first sub-film layer 201, so that the sum of the thicknesses of the first sub-film layer 201 and the second sub-film layer 202 is preferably 150 nm.

Preferably, the ratio between the thicknesses of the first sub-film layer 201 and the second sub-film layer 202 ranges from 0.5 to 2.

However, it is readily understood that the specific thicknesses of the first sub-film layer 201 and the second sub-film layer 202 may be set according to different requirements, and should not be limited thereto.

More preferably, the thicknesses of the first sub-film layer 201 and the second sub-film layer 202 are the same, that is, each is 75 nm so that the sum of them is 150 nm. It is readily understood that such design can ensure that power of the equipment for forming the sub-film layer keeps unchanged in two separate processed under the condition that the production time for a single product is fixed (when the production time for a single product is fixed, the thickness of the film layer is proportional directly to the power of the equipment), and thereby ensure constant conditions of various processes for forming the film layer, which is advantageous for the production.

More preferably, the power of the equipment for forming the second sub-film layer 202 is controlled so that the size of each knobble formed on the second sub-film layer 202 is less than 50 microns.

For example, when the second sub-film layer 202 is formed by the sputtering process, the power of the equipment is preferably controlled below 8 kW, more preferably, within a range of 6.8 kW to 7.8 kW.

It is readily understood that when the power of the equipment for forming the first sub-film layer 201 is preferably equal to that for the second sub-film layer 202, the thicknesses of the sub-films formed in the two steps are equal, which is advantageous for production. For example, when the production time for a single product is 35 s, the power of the equipment for forming the first sub-film layer 201 and the second sub-film layer 202 is preferably 7.3 kW. That is to say, the power of the equipment is determined according to the production time of a single product, so that the size of each knobble formed on the first sub-film layer 201 and the second sub-film layer 202 is less than 50 microns.

In S104, a second cleaning process is performed on the second sub-film layer 202.

Preferably, the second cleaning process includes cleaning with pure water and cleaning with gas, and is used for removing the bumps on the second sub-film layer 202 formed due to the foreign matters 21 and the knobbles on the second sub-film layer 202.

Specifically, the second cleaning process includes: washing with pure water while rotating a brush to cooperate with the washing, wherein the flow velocity of the pure water ranges from 145 L/min to 150 L/min, and is preferably 150 L/min; washing with both pure water and clean air, wherein the flow velocity of the two-fluid (the pure water and the clean air) ranges from 55 L/min to 60 L/min, and is preferably 60 L/min; rinsing with pure water, wherein the flow velocity of the pure water ranges from 135 L/min to 140 L/min, and is preferably 138 L/min; and blow-drying with an air knife device, wherein the flow velocity of the air ranges from 3300 L/min to 3500 L/min, and is preferably 3400 L/min.

Figure 1:
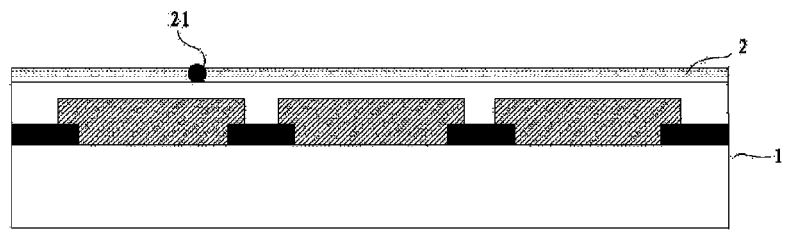
FIG. 1 is a structural diagram illustrating that there is a foreign matter in a film layer after a color film substrate is coated with the film layer in the prior art.
Figure 2:
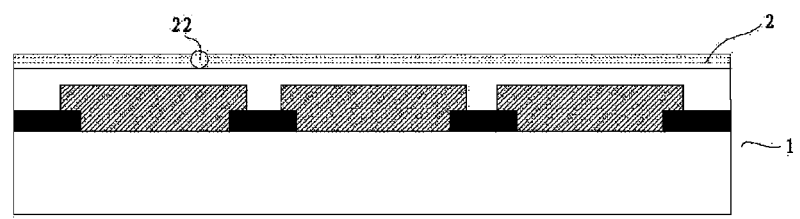
FIG. 2 is a structural diagram of the color film substrate coated with a film layer in which a pin hole is generated in the prior art.
Figure 6:
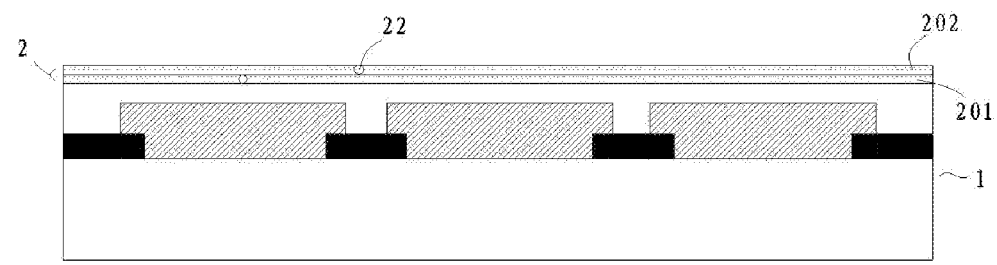
FIG. 6 is a schematic diagram illustrating the structure after a second cleaning process is performed on the second sub-film layer by using the method of forming a film layer according to the embodiment 1 of the invention.
Figure 7:
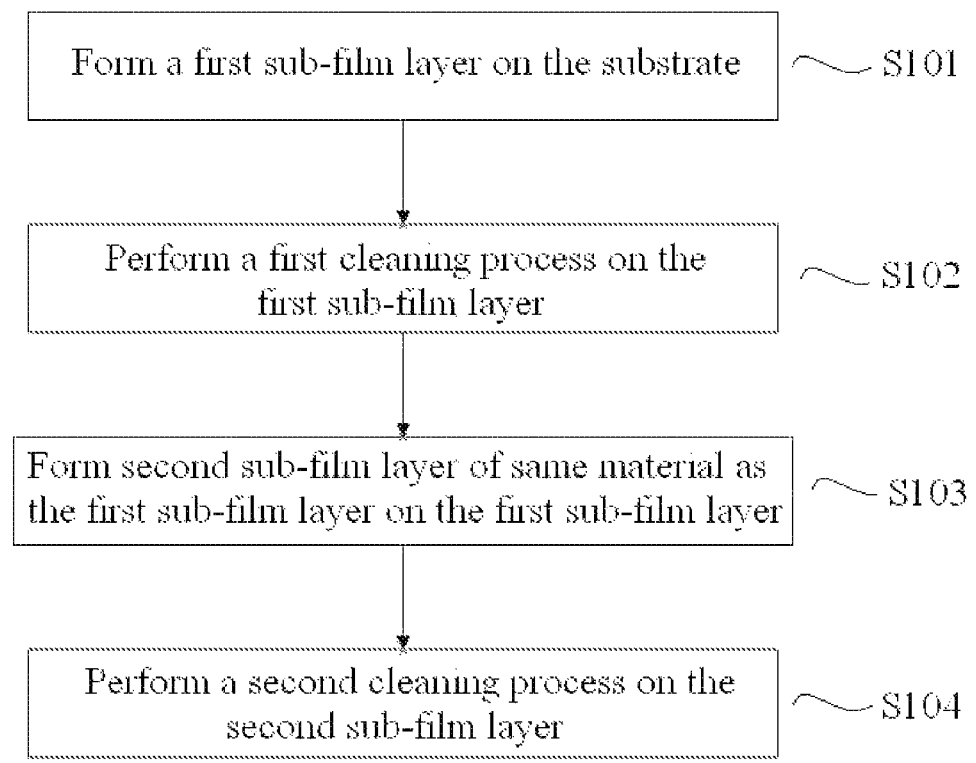
FIG. 7 is a flow chart of the method of forming a film layer according to the embodiment 1 of the invention.

As shown in FIG. 6, when the second cleaning process is performed, the bump corresponding to the foreign matter 21 on the second sub-film layer 202 is removed by washing, and thereby the pin hole 22 is formed. The probability that the pin hole 22 on the first sub-film layer 201 and the pin hole 22 on the second sub-film layer 202 are positioned at the same position is very small, thus the case shown in FIG. 2 (i.e., the case that the pin hole 22 passes through the whole film layer) hardly occurs in the multi-layer film, even if pin holes 22 are formed at certain positions on the respective sub-film layers. Thereby the imaging effect of the display panel is improved. It is readily understood that the conditions for the second cleaning process are the same as those for the first cleaning process, thereby the utilization of the equipment for cleaning is improved and the efficiency is increased.

It should be pointed out that, before performing the steps in the method for forming the film layer according to the present embodiment, other conventional steps may be provided, such as the OC process (forming OC planarizing layer) and the pre-cleaning process. Meanwhile, after performing the steps in the method for forming the film layer according to the present embodiment, other conventional steps may also be provided, such as the baking process, the detecting process, and the like. The invention is not limited thereto.

Furthermore, the method for forming the film layer according to the present embodiment may be used to fabricate other types of film layers, and may be followed by a patterning process so as to form lead wires, pixel electrodes and so on with the film layers (i.e., the final film layer may not be a complete "film layer" but a patterned film layer).

The method for forming the film layer according to the present embodiment includes a plurality of steps (two steps in the present embodiment) for forming sub-film layers, and the cleaning process is performed each time a sub-film layer is formed, thus, although the pin holes 22 may be generated in each of the sub-film layers formed in different steps, there is little chance that the pin holes 22 are formed at the same position in the sub-film layers formed in different steps. That is, the sub-film layers formed in different steps complement each other, which prevents the pin holes 22 in the sub-film layer formed in a single step from affecting the entire film layer, and thereby the problem of bad imaging quality of the display panel resulting from the pin holes 22 is reduced. Furthermore, since the process for forming the film layer is performed by plural sub-film forming steps, the power of the equipment for forming each sub-film layer can be lowered, which reduces the number of the knobbles generated on the formed sub-film layer and the probability of the generation of the pin holes 22, and further ensure the quality of the film layer (characteristics of the film surface, the resistance of the film surface and the transmittance are more likely to comply with the standard). Meanwhile, the number of the bumps on the film is reduced, and the time for subsequent repairing and polishing processes is shortened, and thereby the utilization of the whole production line is improved.

Embodiment 2

The present embodiment provides a substrate comprising a film layer formed by using the above-described method for forming a film layer.

Preferably, the substrate is a color substrate, and the film layer serves as a common electrode.

Preferably, the thickness of the film layer ranges from 135 nm to 150 nm.

Preferably, the material of the film layer is a conductive material, and more preferably, is indium tin oxide.

The film layer on the substrate according to the present embodiment is formed by plural sub-film forming steps, and the cleaning process is performed each time a sub-film layer is formed, thus, although defects in film surface (e.g. the pin holes 22) may be generated in each of the sub-film layers formed in different steps, the probability that the defects in film surface (e.g. the pin holes 22) are formed at the same position in the sub-film layers formed in different steps is very small. That is, the sub-film layers formed in different steps complement each other, which prevents the pin holes 22 in the sub-film layer formed in a single step from affecting the entire film layer, and thereby the problem of bad imaging quality of the display panel resulting from the pin holes 22 is reduced. Furthermore, since the process for forming the film layer is performed by plural sub-film forming steps, the power of the equipment for forming each sub-film layer can be lowered, which reduces the number of the knobbles generated on the formed sub-film layer and the probability of the generation of the pin holes 22, and further ensure the quality of the film layer (characteristics of the film surface, the resistance of the film surface and the transmittance are more likely to comply with the standard). Meanwhile, the time for subsequent repairing and polishing processes for removing the knobbles on the film surface is shortened, the production efficiency is improved and excellent quality of the substrate can be ensured.

It will be understood that the above embodiments are exemplary implementations for explaining the principle of the invention and not for limiting the present invention. Some of the technical features may be omitted in the embodiments so as to solve parts of the technical problems in the prior art. Moreover, the technical features disclosed therein may be combined in arbitrary manners. A person skilled in the art can understand that various modifications and improvements may be made without departing from the scope of the invention and should be deemed as being covered by the invention. The scope of the invention is defined by the following claims.

What is claimed is:

1. A method of forming a film layer, comprising:
   forming a plurality of sub-film layers of a same material overlapped with each other on a substrate by multiple operations to constitute the film layer, wherein the material is a metal or a metal oxide, wherein each time a sub-film layer is formed, the newly-formed sub-film layer is cleaned immediately and wherein power of equipment for forming the sub-film layers is controlled in a range of 6.8 kW to 7.8 kW, wherein each of knobbles formed on the sub-film layers is less than 50 microns in size.

2. The method of forming a film layer according to claim 1, wherein the plurality of sub-film layers includes two sub-film layers, and the method comprises:
   forming a first sub-film layer on the substrate;
   performing a first cleaning process on the first sub-film layer;
   forming a second sub-film layer on the first sub-film layer; and
   performing a second cleaning process on the second sub-film layer.

3. The method of forming a film layer according to claim 2, wherein
   the ratio between the thicknesses of the first sub-film layer and the second sub-film layer ranges from 0.5 to 2.

4. The method of forming a film layer according to claim 3, wherein
   the thickness of the first sub-film layer is equal to that of the second sub-film layer.

5. The method of forming a film layer according to claim 2, wherein the operation of forming the first sub-film layer is performed by one of evaporating process, sputtering process, chemical vapor deposition process and spraying process; and
   the operation of forming the second sub-film layer is performed by one of evaporating process, sputtering process, chemical vapor deposition process and spraying process.

6. The method of forming a film layer according to claim 1, wherein the cleaning process includes cleaning with pure water and cleaning with gas, and is used for removing foreign matters and knobbles on the sub-film layers.

7. The method of forming a film layer according to claim 1, wherein the film layer is a common electrode in a color film substrate.

8. The method of forming a film layer according to claim 1, wherein the thickness of the film layer ranges from 135 nm to 150 nm.

9. The method of forming a film layer according to claim 1, wherein the material of the film layer is indium tin oxide.

* * * * *